(12) United States Patent
Yamada

(10) Patent No.: US 10,819,311 B2
(45) Date of Patent: Oct. 27, 2020

(54) ELASTIC WAVE DEVICE

(71) Applicant: Murata Manufacturing Co., Ltd., Nagaokakyo-shi, Kyoto-fu (JP)

(72) Inventor: Takayuki Yamada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 268 days.

(21) Appl. No.: 15/961,922

(22) Filed: Apr. 25, 2018

(65) Prior Publication Data

US 2018/0241373 A1 Aug. 23, 2018

Related U.S. Application Data

(63) Continuation of application No. PCT/JP2016/081850, filed on Oct. 27, 2016.

(30) Foreign Application Priority Data

Oct. 30, 2015 (JP) .................................. 2015-214777

(51) Int. Cl.
*H03H 9/64* (2006.01)
*H03H 9/02* (2006.01)
(Continued)

(52) U.S. Cl.
CPC ......... *H03H 9/6489* (2013.01); *H01L 41/047* (2013.01); *H01L 41/0533* (2013.01);
(Continued)

(58) Field of Classification Search
CPC .... H03H 9/58; H03H 7/0153; H03H 9/02559; H03H 9/0576; H03H 9/1071;
(Continued)

(56) References Cited

U.S. PATENT DOCUMENTS

2003/0076194 A1* 4/2003 Machui ................... H04B 1/52
333/133
2005/0017823 A1 1/2005 Sakano et al.
(Continued)

FOREIGN PATENT DOCUMENTS

JP 2005-065225 A 3/2005
JP 2006-074749 A 3/2006
(Continued)

OTHER PUBLICATIONS

Huang et al., "Influence of Waterproof Films on the Atomization Behavior of Surface Acoustic Waves" published in Micromachines, 2019. (Year: 2019).*
(Continued)

*Primary Examiner* — Benny T Lee
*Assistant Examiner* — Hafizur Rahman
(74) *Attorney, Agent, or Firm* — Keating & Bennett, LLP

(57) ABSTRACT

An elastic wave device includes a first piezoelectric substrate made of $LiNbO_3$, a first band-pass filter provided on the first piezoelectric substrate and including first IDT electrodes, a dielectric layer provided on the first piezoelectric substrate and covering the plurality of first IDT electrodes, a second piezoelectric substrate, a second band-pass filter provided on the second piezoelectric substrate, including second IDT electrodes, and differing from the first band-pass filter in pass band, and a band elimination filter connected to the first band-pass filter. The band elimination filter is provided on a piezoelectric substrate other than the first piezoelectric substrate.

21 Claims, 6 Drawing Sheets

(51) Int. Cl.
| | |
|---|---|
| *H03H 9/05* | (2006.01) |
| *H03H 9/10* | (2006.01) |
| *H03H 9/72* | (2006.01) |
| *H01L 41/047* | (2006.01) |
| *H01L 41/053* | (2006.01) |
| *H01L 41/18* | (2006.01) |
| *H03H 7/01* | (2006.01) |
| *H03H 9/54* | (2006.01) |
| *H03H 9/58* | (2006.01) |

(52) U.S. Cl.
CPC ......... *H01L 41/183* (2013.01); *H03H 7/0153* (2013.01); *H03H 9/02559* (2013.01); *H03H 9/0576* (2013.01); *H03H 9/1071* (2013.01); *H03H 9/542* (2013.01); *H03H 9/58* (2013.01); *H03H 9/6409* (2013.01); *H03H 9/6436* (2013.01); *H03H 9/6483* (2013.01); *H03H 9/725* (2013.01)

(58) Field of Classification Search
CPC .... H03H 9/542; H03H 9/6409; H03H 9/6436; H03H 9/6483; H03H 9/725; H03H 9/6489; H01L 41/047; H01L 41/0533; H01L 41/183
USPC .......................................................... 333/195
See application file for complete search history.

(56) References Cited

U.S. PATENT DOCUMENTS

| | | |
|---|---|---|
| 2010/0109801 A1 | 5/2010 | Inoue et al. |
| 2011/0187478 A1 | 8/2011 | Link et al. |
| 2013/0314173 A1 | 11/2013 | Inoue |
| 2015/0365069 A1 | 12/2015 | Durner et al. |
| 2016/0126932 A1 | 5/2016 | Nakai et al. |

FOREIGN PATENT DOCUMENTS

| | | |
|---|---|---|
| JP | 2006-295976 A | 10/2006 |
| JP | 2009-260463 A | 11/2009 |
| JP | 2010-109894 A | 5/2010 |
| JP | 2012-501564 A | 1/2012 |
| JP | 2013-247466 A | 12/2013 |
| WO | 2013/128636 A1 | 9/2013 |
| WO | 2014/139590 A1 | 9/2014 |
| WO | 2014/196245 A1 | 12/2014 |

OTHER PUBLICATIONS

Kuang et al., "RF and Microwave Microelectronics Packaging II", Springer, 2017, pp. 93-94, (Year: 2017).*
Memscyclopedia.org newsletter on SU8 resist published on Sep. 2018 (Year: 2018).*
Official Communication issued in International Patent Application No. PCT/JP2016/081850, dated Jan. 17, 2017.

* cited by examiner

ELASTIC WAVE DEVICE

CROSS REFERENCE TO RELATED APPLICATIONS

This application claims the benefit of priority to Japanese Patent Application No. 2015-214777 filed on Oct. 30, 2015 and is a Continuation Application of PCT Application No. PCT/JP2016/081850 filed on Oct. 27, 2016. The entire contents of each application are hereby incorporated herein by reference.

BACKGROUND OF THE INVENTION

1. Field of the Invention

The present invention relates to an elastic wave device.

2. Description of the Related Art

To increase the speed of communications, carrier aggregation (CA) and the like are used. In CA, a common connection is typically made between or among antenna terminals of a plurality of band-pass filters, and a plurality of signals in different frequency bands are transmitted and received simultaneously. This increases the speed of communications. An elastic wave device is used as the band-pass filters.

In an elastic wave device disclosed in Japanese Unexamined Patent Application Publication No. 2006-295976, an IDT electrode is provided on a piezoelectric substrate made of $LiNbO_3$. The IDT electrode is covered by an insulating layer made of $SiO_2$ provided on the piezoelectric substrate.

In the elastic wave device disclosed in Japanese Unexamined Patent Application Publication No. 2006-295976, attenuation in a band other than a pass band decreases due to the occurrence of a higher-order mode in some cases. In the case in which such an elastic wave device is used in CA, in the vicinity of a frequency band of a higher-order mode, a pass band of another band-pass filter device is located in some cases. For this reason, a ripple occurs in the pass band of the other band-pass filter device in some cases. Furthermore, insertion loss of the band-pass filter device deteriorates in some cases.

SUMMARY OF THE INVENTION

Preferred embodiments of the present invention provide elastic wave devices that enable a higher-order mode to be effectively reduced or prevented.

An elastic wave device according to a preferred embodiment of the present invention includes a first piezoelectric substrate made of $LiNbO_3$; a first band-pass filter provided on the first piezoelectric substrate and including a plurality of first IDT electrodes; a dielectric layer provided on the first piezoelectric substrate and covering the plurality of first IDT electrodes; a second piezoelectric substrate; a second band-pass filter provided on the second piezoelectric substrate, including a plurality of second IDT electrodes, and differing from the first band-pass filter in pass band; and a band elimination filter connected to the first band-pass filter. The band elimination filter is provided on a piezoelectric substrate other than the first piezoelectric substrate.

In an elastic wave device according to a preferred embodiment of the present invention, the first band-pass filter includes a first terminal that is one of an input terminal and an output terminal, and the band elimination filter is connected between the first terminal and a ground potential. In this case, for example, deterioration of insertion loss of a band-pass filter other than the first band-pass filter is less likely to occur.

In an elastic wave device according to a preferred embodiment of the present invention, the band elimination filter includes a plurality of parallel arm resonators connected in parallel between the first terminal and the ground potential. In this case, attenuation in a stop band of the band elimination filter is able to be increased. Thus, in the first band-pass filter, a higher-order mode is able to be further reduced or prevented. Furthermore, the band elimination filter is able to be miniaturized.

In an elastic wave device according to a preferred embodiment of the present invention, the second band-pass filter includes a plurality of terminals, the band elimination filter includes a second terminal connected to the first terminal, and a distance between the second terminal and the first terminal is shorter than a distance between any terminal included in the second band-pass filter and the first terminal. In this case, parasitic capacitance between the first band-pass filter and the band elimination filter is able to be reduced. Thus, deterioration of insertion loss of the elastic wave device is less likely to occur.

In an elastic wave device according to a preferred embodiment of the present invention, a third piezoelectric substrate made of $LiTaO_3$ is further included, and the band elimination filter is provided on the third piezoelectric substrate. In this case, the occurrence of a higher-order mode in the band elimination filter is able to be reduced or prevented.

In an elastic wave device according to a preferred embodiment of the present invention, the band elimination filter is provided on the second piezoelectric substrate.

In an elastic wave device according to a preferred embodiment of the present invention, the second piezoelectric substrate is made of $LiTaO_3$. In this case, the occurrence of a higher-order mode in the band elimination filter is able to be reduced or prevented.

In an elastic wave device according to a preferred embodiment of the present invention, the first band-pass filter includes a third terminal connected to an antenna, the second band-pass filter includes a fourth terminal connected to the antenna, and the third terminal and the fourth terminal are connected. A pass band of the first band-pass filter is located on a lower-frequency side than a pass band of the second band-pass filter. In this case, deterioration of insertion loss of the elastic wave device is less likely to occur.

In an elastic wave device according to a preferred embodiment of the present invention, the band elimination filter includes at least one third IDT electrode.

In an elastic wave device according to a preferred embodiment of the present invention, a shortest distance between centers of electrode fingers in the third IDT electrode is shorter than a shortest distance between centers of electrode fingers in the plurality of second IDT electrodes. In this case, the band elimination filter is able to be miniaturized. Thus, a high degree of flexibility in the design of an electrode structure and other elements on the second piezoelectric substrate is able to be provided.

Preferred embodiments of the present invention provide elastic wave devices in which the occurrence of a higher-order mode is effectively reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention will be described below with reference to the drawings in order to clarify the present invention.

It is noted that the preferred embodiments described in the present description are illustrative, and that configurations may be partially replaced or combined with each other between different preferred embodiments.

Figure 1:
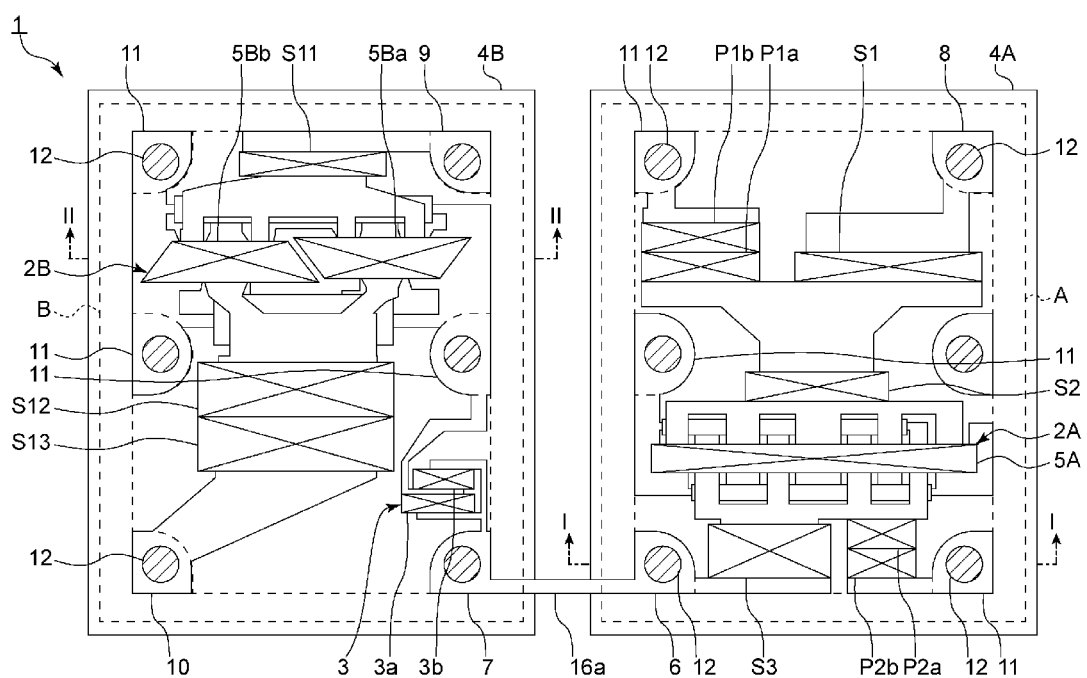
FIG. 1 is a schematic plan cross-sectional view illustrating an electrode structure of an elastic wave device according to a first preferred embodiment of the present invention.

FIG. 1 is a schematic plan cross-sectional view illustrating an electrode structure of an elastic wave device according to a first preferred embodiment of the present invention. A dielectric layer and a support member, which will be described, are omitted in FIG. 1. Furthermore, elastic wave resonators and longitudinally coupled resonator elastic wave filters, which will be described, are schematically represented by rectangles in which two diagonals are drawn. The same is true for FIGS. 3, 4, 7, and 8.

Figure 2A:
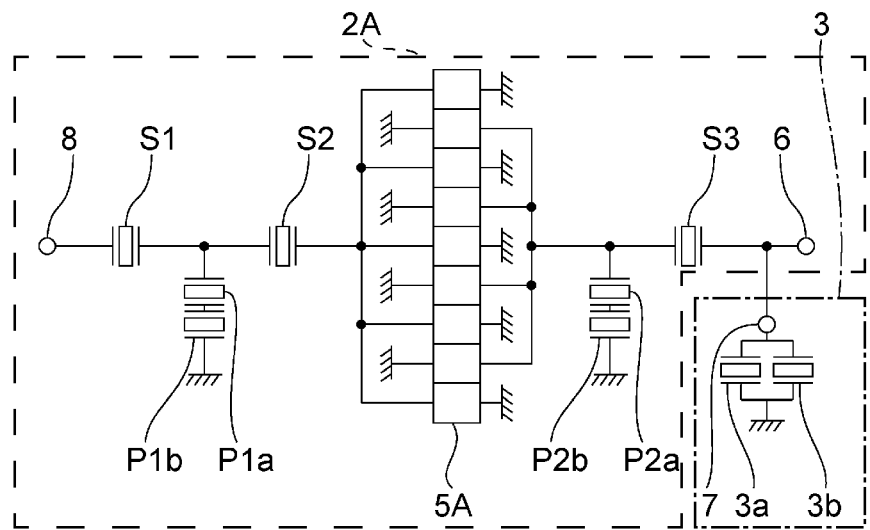
FIG. 2A is a circuit diagram of a first band-pass filter and a band elimination filter in the first preferred embodiment of the present invention.
Figure 2B:
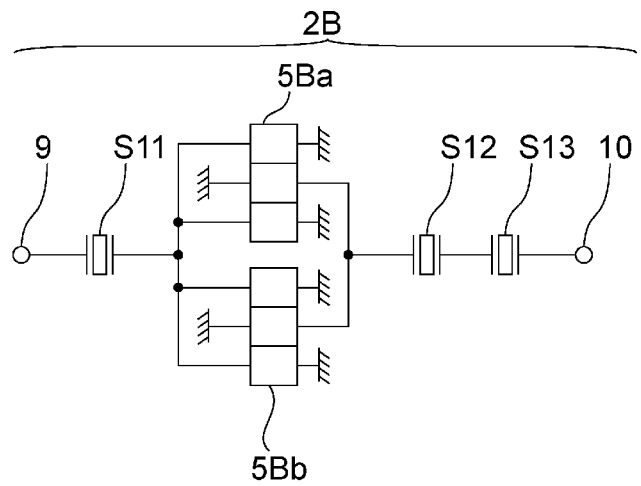
FIG. 2B is a circuit diagram of a second band-pass filter.

FIG. 2A is a circuit diagram of a first band-pass filter and a band elimination filter in the first preferred embodiment, and FIG. 2B is a circuit diagram of a second band-pass filter.

As illustrated in FIG. 1, an elastic wave device 1 includes first and second piezoelectric substrates 4A and 4B. The first piezoelectric substrate 4A is preferably made of $LiNbO_3$, for example. The second piezoelectric substrate 4B is preferably made of $LiTaO_3$, for example. On the first piezoelectric substrate 4A, a first band-pass filter 2A including a plurality of first IDT electrodes is provided. On the second piezoelectric substrate 4B, a second band-pass filter 2B that differs from the first band-pass filter 2A in pass band is provided. The second band-pass filter 2B includes a plurality of second IDT electrodes. The first and second IDT electrodes may be different from or the same as each other in terms of the number of pairs of electrode fingers, the length of an electrode finger, and other parameters thereof.

On the second piezoelectric substrate 4B, a band elimination filter 3 including at least one third IDT electrode is also provided. Thus, the band elimination filter 3 is provided on a piezoelectric substrate other than the first piezoelectric substrate 4A. In the case in which the band elimination filter 3 includes a plurality of third IDT electrodes, the third IDT electrodes may be different from each other in terms of the number of pairs of electrode fingers, the length of an electrode finger, and other parameters thereof.

As illustrated in FIG. 2A, the band elimination filter 3 is connected to the first band-pass filter 2A. In the present preferred embodiment, the band elimination filter 3 is connected between the first band-pass filter 2A and a ground potential.

The first band-pass filter 2A is preferably a Band 25 reception filter, for example. Thus, a pass band of the first band-pass filter 2A ranges from 1930 MHz to 1995 MHz inclusive. The second band-pass filter 2B is preferably a Band 4 reception filter, for example. Thus, a pass band of the second band-pass filter 2B ranges from 2110 MHz to 2155 MHz inclusive. The pass bands of the first and second band-pass filters 2A and 2B are not limited to these. Furthermore, at least one of the first and second band-pass filters 2A and 2B may be a transmission filter.

A feature of the present preferred embodiment is that the first band-pass filter 2A is connected to the band elimination filter 3. Thus, a higher-order mode in the first band-pass filter 2A in the elastic wave device 1 is able to be effectively reduced or prevented. This will be described below together with a specific configuration of the present preferred embodiment.

As illustrated in FIG. 2A, the first band-pass filter 2A includes a first terminal 6 that is an output terminal, and a third terminal 8 connected to an antenna. The band elimination filter 3 includes a second terminal 7 connected to the first terminal 6. As described above, the first band-pass filter 2A may be a transmission filter. In this case, the first terminal 6 is an input terminal.

The first band-pass filter 2A includes a plurality of elastic wave resonators S1 to S3, P1a, P1b, P2a, and P2b, and a first longitudinally coupled resonator elastic wave filter 5A. The plurality of elastic wave resonators S1 to S3, P1a, P1b, P2a, and P2b, and the first longitudinally coupled resonator elastic wave filter 5A each include the first IDT electrodes. In the present preferred embodiment, although the first longitudinally coupled resonator elastic wave filter 5A is preferably a 9-IDT longitudinally coupled resonator elastic wave filter, the number of IDT electrodes included by the first longitudinally coupled resonator elastic wave filter 5A is not limited to a particular number.

The plurality of elastic wave resonators S1 and S2 are connected in series with each other between the third terminal 8 and the first longitudinally coupled resonator elastic wave filter 5A. The elastic wave resonator S3 is connected between the first longitudinally coupled resonator elastic wave filter 5A and the first terminal 6. The plurality of elastic wave resonators P1a and P1b are connected in series with each other between a connection point between the elastic wave resonator S1 and the elastic wave resonator S2 and the ground potential. The plurality of elastic wave resonators P2a and P2b are connected in series with each other between a connection point between the first longitudinally coupled resonator elastic wave filter 5A and the elastic wave resonator S3 and the ground potential.

The band elimination filter 3 includes two parallel arm resonators 3a and 3b. The parallel arm resonators 3a and 3b are connected in parallel with each other between the second terminal 7 and the ground potential.

On the other hand, as illustrated in FIG. 2B, the second band-pass filter 2B includes a fourth terminal 9 connected to the antenna, and a fifth terminal 10 that is an output terminal.

The second band-pass filter 2B includes a plurality of elastic wave resonators S11 to S13, and second longitudinally coupled resonator elastic wave filters 5Ba and 5Bb. The plurality of elastic wave resonators S11 to S13, and the second longitudinally coupled resonator elastic wave filters 5Ba and 5Bb each include the second IDT electrodes. In the present preferred embodiment, although each of the second longitudinally coupled resonator elastic wave filters 5Ba and 5Bb is a 3-IDT longitudinally coupled resonator elastic wave filter, the number of IDT electrodes included by each of the second longitudinally coupled resonator elastic wave filters 5Ba and 5Bb is not limited to a particular number.

The elastic wave resonator S11 is connected between the fourth terminal 9 and the second longitudinally coupled resonator elastic wave filters 5Ba and 5Bb. The plurality of elastic wave resonators S12 and S13 are connected in series with each other between the second longitudinally coupled resonator elastic wave filters 5Ba and 5Bb and the fifth terminal 10. The plurality of second longitudinally coupled resonator elastic wave filters 5Ba and 5Bb are connected in parallel with each other between the elastic wave resonator S11 and the elastic wave resonator S12.

As illustrated in FIG. 1, the elastic wave device 1 has, on the first and second piezoelectric substrates 4A and 4B, electrode structures corresponding to the circuits illustrated in FIGS. 2A and 2B. On the first and second piezoelectric substrates 4A and 4B, the first to fifth terminals 6 to 10 and a plurality of ground terminals 11 connected to the ground potential are provided. The first terminal 6 and the second terminal 7 are connected with a first connection electrode 16a. The electrode structures and circuit configurations of the first and second band-pass filters 2A and 2B and the band elimination filter 3 are not limited to particular electrode structures and circuit configurations.

Figure 3:
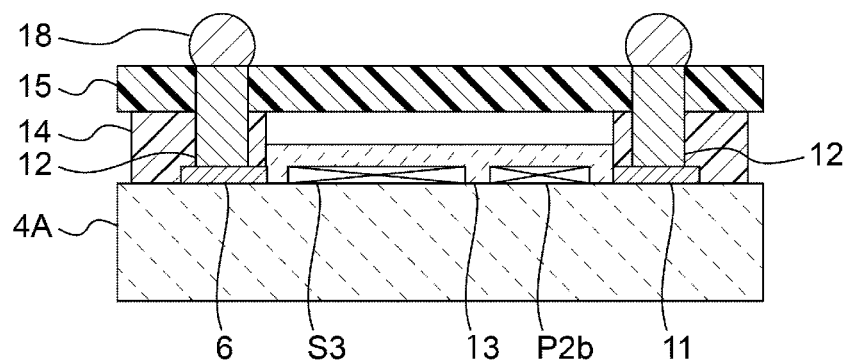
FIG. 3 is a schematic cross-sectional view of the first band-pass filter in the first preferred embodiment of the present invention corresponding to a section taken along line I-I of FIG. 1.
Figure 4:
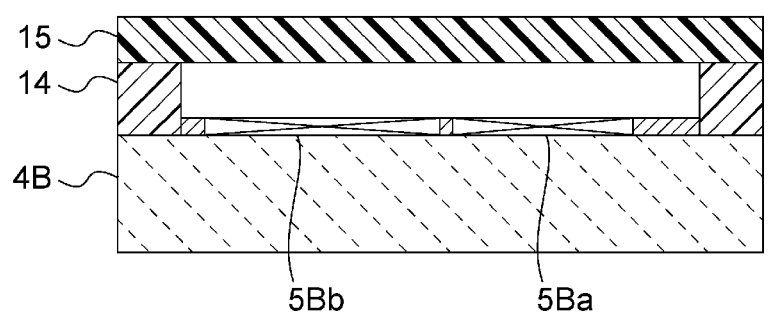
FIG. 4 is a schematic cross-sectional view of the second band-pass filter in the first preferred embodiment of the present invention corresponding to a section taken along line II-II of FIG. 1

FIG. 3 is a schematic cross-sectional view of the first band-pass filter in the first preferred embodiment corresponding to a section taken along line I-I of FIG. 1. FIG. 4 is a schematic cross-sectional view of the second band-pass filter in the first preferred embodiment corresponding to a section taken along line II-II of FIG. 1.

As illustrated in FIG. 3, a dielectric layer 13 preferably made of $SiO_2$, for example, is provided on the first piezoelectric substrate 4A. The dielectric layer 13 covers the plurality of first IDT electrodes. More specifically, the dielectric layer 13 covers the plurality of elastic wave resonators S1 to S3, P1a, P1b, P2a, and P2b, and the first longitudinally coupled resonator elastic wave filter 5A that are illustrated in FIG. 1. Thus, temperature characteristics of the first band-pass filter 2A provided on the first piezoelectric substrate 4A preferably made of $LiNbO_3$ is able to be improved.

A dielectric of which the dielectric layer 13 is made is not limited to a particular dielectric.

On the other hand, as illustrated in FIG. 4, no dielectric layer is provided on the second piezoelectric substrate 4B.

Although a support member is omitted in FIG. 1, the support member is provided in a position indicated by a dashed line A on the first piezoelectric substrate 4A. The support member surrounds a portion in which the first band-pass filter 2A is provided. As illustrated in FIG. 3, a cover member 15 is provided on a support member 14. A hollow space surrounded by the first piezoelectric substrate 4A, the support member 14, and the cover member 15 is provided.

Similarly, a support member is also provided in a position indicated by a dashed line B illustrated in FIG. 1 on the second piezoelectric substrate 4B. As illustrated in FIG. 4, a hollow space surrounded by the second piezoelectric substrate 4B, the support member 14, and the cover member 15 is provided.

Referring to FIG. 1, above the first and second piezoelectric substrates 4A and 4B, a plurality of via electrodes 12 are provided. One-side end portions of the plurality of via electrodes 12 are connected to the first to fifth terminals 6 to 10 and the ground terminals 11. As illustrated in FIG. 3, each via electrode 12 extends through the support member 14 and the cover member 15. A bump 18 is connected to the other-side end portion of each via electrode 12. Similarly, each via electrode provided above the second piezoelectric substrate also extends through the support member and the cover member and is connected to a bump.

Thus, in the present preferred embodiment, the first and second band-pass filters preferably have a wafer-level packaging (WLP) structure, for example. Note that the first and second band-pass filters may have a package structure other than a WLP structure, such as a chip size package (CSP) structure.

Next, effects and advantages of the present preferred embodiment will be described by comparing the present preferred embodiment with a comparative example.

The comparative example differs from the first preferred embodiment in that the first band-pass filter is not connected to the band elimination filter. In aspects other than this, an elastic wave device in the comparative example has the same or substantially the same configuration as the elastic wave device 1 in the first preferred embodiment.

Figure 5:
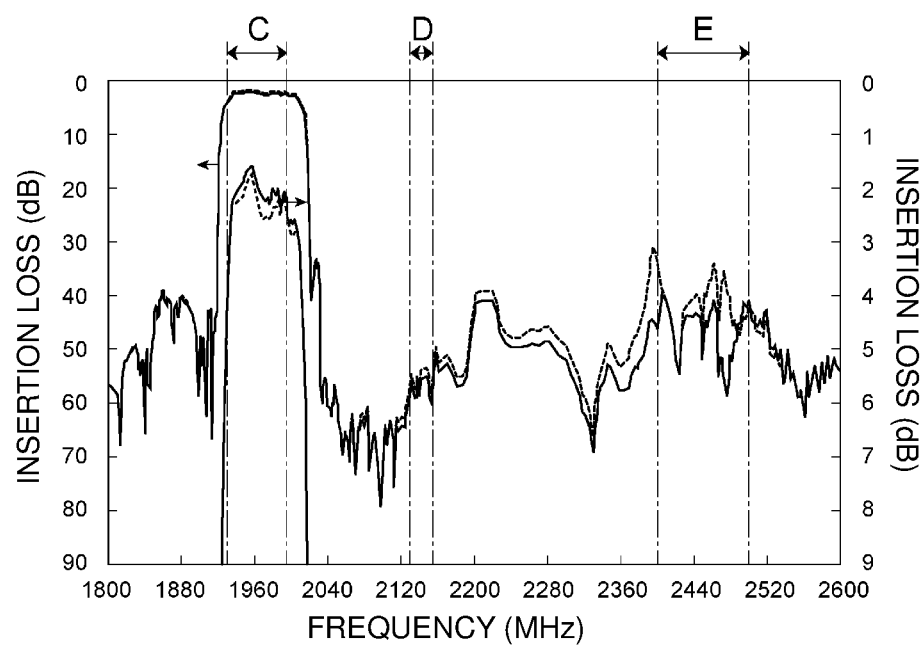
FIG. 5 illustrates attenuation-frequency characteristics of the first band-pass filter in the first preferred embodiment of the present invention and a comparative example.

FIG. 5 illustrates attenuation-frequency characteristics of the first band-pass filter (Insertion Loss, IL) in the first preferred embodiment and the comparative example. A solid line indicates a result obtained in the first preferred embodiment, and a dashed line indicates a result obtained in the comparative example. A frequency band C indicates the pass band of the first band-pass filter, and a frequency band D indicates the pass band of the second band pass filter. A frequency band E indicates a WiFi band. The right vertical axis indicates more explicitly the insertion loss within the frequency band C.

In the comparative example, in the vicinity of the WiFi band that is the vicinity of a frequency band about 1.2 times higher than the pass band of the first band-pass filter, a higher-order mode occurs. This higher-order mode occurs due to the fact that the dielectric layer is provided.

On the other hand, it was discovered that a higher-order mode is able to be reduced or prevented in the present preferred embodiment. The band elimination filter is connected to the first band-pass filter. The band elimination filter is defined by the plurality of parallel arm resonators that provide respective stop bands. Thus, the band elimination filter has a plurality of stop bands. Each stop band is located in the vicinity of a frequency at which a higher-order mode occurs. Thus, a higher-order mode is able to be effectively reduced or prevented. As described above, in the present preferred embodiment, temperature characteristics of the first band-pass filter are able to be improved by providing the dielectric layer, and a higher-order mode is able to be reduced or prevented. Thus, the elastic wave device 1 in this preferred embodiment is able to be suitably used in CA and other applications.

The configuration of the band elimination filter is not limited to a particular configuration, and the band elimination filter preferably has at least one stop band. The band elimination filter may preferably be configured in accordance with a higher-order mode that occurs in the first band-pass filter.

Referring to FIG. 2A, in the present preferred embodiment, the band elimination filter 3 is preferably defined by the parallel arm resonators 3a and 3b. This further increases attenuation in a stop band of the band elimination filter 3. Thus, a higher-order mode is able to be further reduced or prevented. Furthermore, the band elimination filter 3 is able to be miniaturized. The band elimination filter 3 is provided on the second piezoelectric substrate 4B. Thus, a high degree of flexibility in the design of an electrode structure and other elements on the second piezoelectric substrate 4B is provided.

The second piezoelectric substrate 4B is preferably made of $LiTaO_3$, for example. Thus, the occurrence of a higher-order mode in the band elimination filter 3 is able to be reduced or prevented. Therefore, the elastic wave device 1 in the present preferred embodiment is able to be further suitably used in CA and other applications.

The second piezoelectric substrate 4B may also be made of $LiNbO_3$, for example.

It is preferable that a shortest distance between the centers of electrode fingers in the third IDT electrode of the band elimination filter 3 is shorter than a shortest distance between the centers of electrode fingers in the plurality of second IDT electrodes of the second band-pass filter 2B. This makes it possible to miniaturize the band elimination filter 3. Thus, an even higher degree of flexibility in the design of an electrode structure and other elements on the second piezoelectric substrate 4B is provided.

More preferably, a shortest distance between the centers of electrode fingers in the plurality of second IDT electrodes is shorter than a shortest distance between the centers of electrode fingers in the plurality of first IDT electrodes. In this case, the distance between the centers of electrode fingers in the third IDT electrode is even shorter, and thus, the band elimination filter 3 is able to be further miniaturized.

A distance between the second terminal 7 of the band elimination filter 3 and the first terminal 6 of the first band-pass filter 2A is preferably shorter than a distance between any terminal included in the second band-pass filter 2B and the first terminal 6. This makes it possible to reduce the length of the first connection electrode 16a. Thus, parasitic capacitance between the first band-pass filter 2A and the band elimination filter 3 is able to be reduced. Therefore, deterioration of insertion loss of the elastic wave device 1 is less likely to occur.

Figure 6:
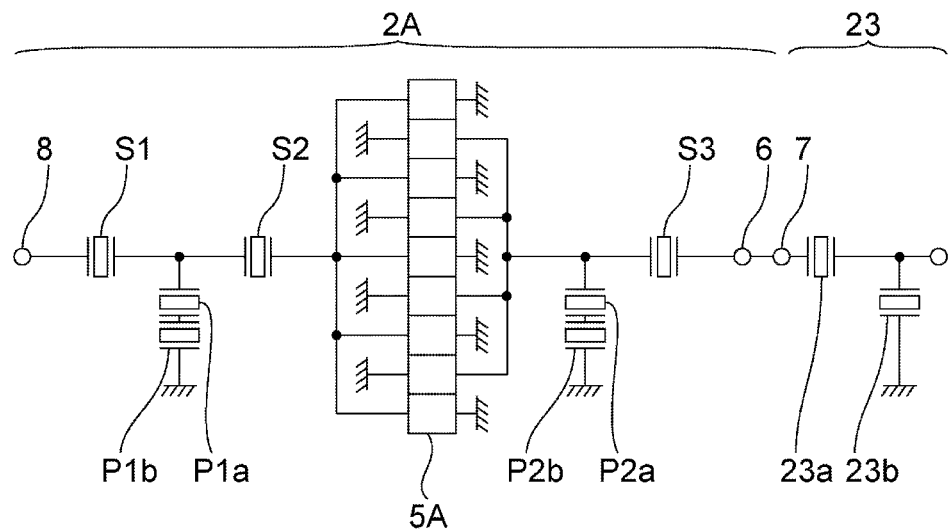
FIG. 6 is a circuit diagram of the first band-pass filter and a band elimination filter in a second preferred embodiment of the present invention.

FIG. 6 is a circuit diagram of the first band-pass filter and a band elimination filter in a second preferred embodiment of the present invention.

The second preferred embodiment differs from the first preferred embodiment in that a band elimination filter 23 is connected in series with the first band-pass filter 2A and in the configuration of the band elimination filter 23. In aspects other than those described above, an elastic wave device in the second preferred embodiment has the same or substantially the same configuration as the elastic wave device 1 in the first preferred embodiment.

The band elimination filter 23 includes a series arm resonator 23a connected to the first band-pass filter 2A and a parallel arm resonator 23b connected between the series arm resonator 23a and the ground potential. Thus, the band elimination filter 23 may preferably have a ladder configuration, for example. In this case, a higher-order mode is able to be reduced or prevented in a wide frequency band.

A stop band of the band elimination filter 23 is provided by an anti-resonant frequency of the series arm resonator 23a and a resonant frequency of the parallel arm resonator 23b. The anti-resonant frequency of the series arm resonator 23a and the resonant frequency of the parallel arm resonator 23b may coincide with or be adjacent to each other.

Figure 7:
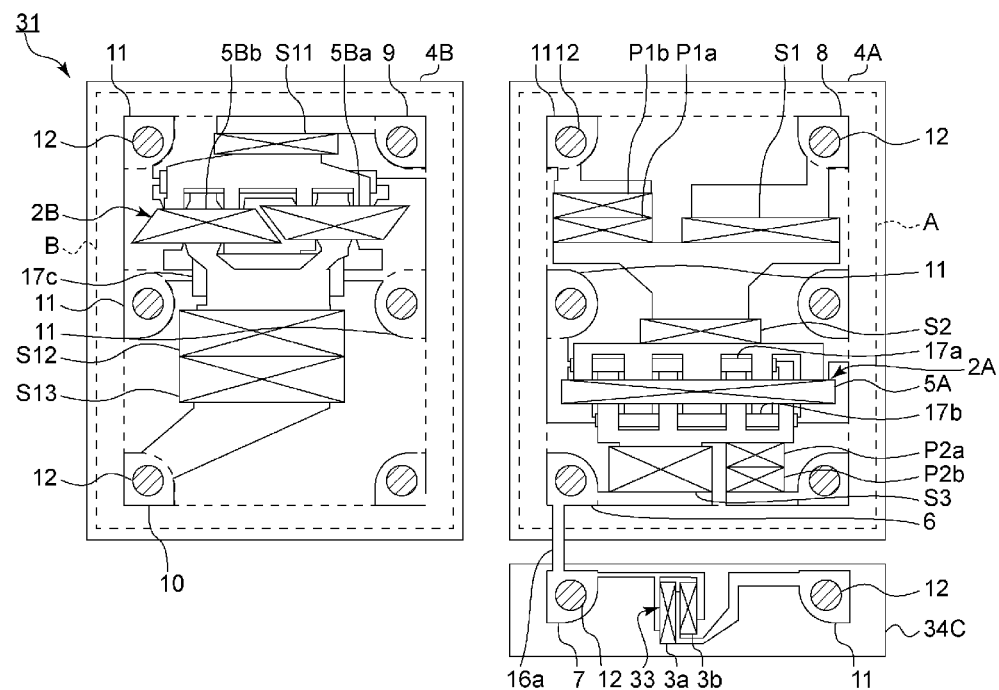
FIG. 7 is a schematic plan cross-sectional view illustrating an electrode structure of an elastic wave device according to a third preferred embodiment of the present invention.

FIG. 7 is a schematic plan cross-sectional view illustrating an electrode structure of an elastic wave device according to a third preferred embodiment of the present invention.

An elastic wave device 31 differs from that in the first preferred embodiment in that the elastic wave device 31 includes a third piezoelectric substrate 34C that differs from the first and second piezoelectric substrates 4A and 4B and in that a band elimination filter 33 is provided on the third piezoelectric substrate 34C. In aspects other than those described above, the elastic wave device 31 has the same or substantially the same configuration as the elastic wave device 1 in the first preferred embodiment.

More specifically, on the third piezoelectric substrate 34C, the second terminal 7 connected to the parallel arm resonators 3a and 3b of the band elimination filter 33 is provided. On the third piezoelectric substrate 34C, the ground terminal 11 connected to the parallel arm resonators 3a and 3b and connected to the ground potential is also provided. The second terminal 7 is connected to the first terminal 6 with the first connection electrode 16a.

In the present preferred embodiment, a higher-order mode in the first band-pass filter 2A is able to be reduced or prevented.

It is preferably that the third piezoelectric substrate 34C is made of $LiTaO_3$, for example. Thus, as in the first preferred embodiment, the occurrence of a higher-order mode in the band elimination filter 33 is able to be reduced or prevented. The third piezoelectric substrate 34C may also be made of $LiNbO_3$.

Figure 8:
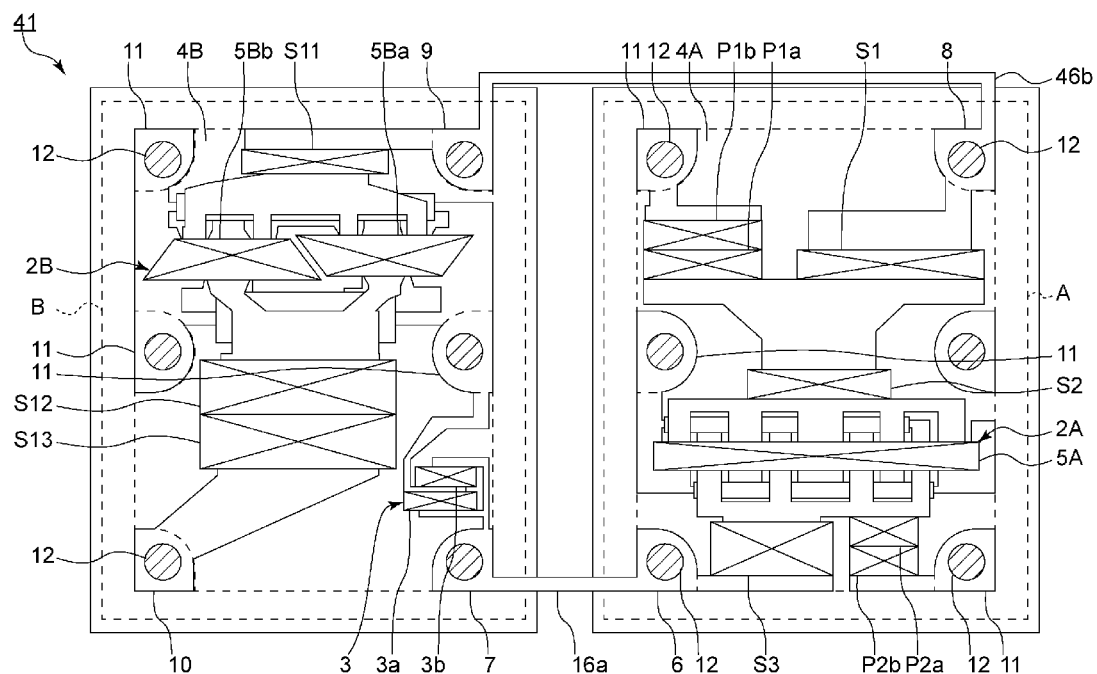
FIG. 8 is a schematic plan cross-sectional view illustrating an electrode structure of an elastic wave device according to a fourth preferred embodiment of the present invention.

FIG. 8 is a schematic plan cross-sectional view illustrating an electrode structure of an elastic wave device according to a fourth preferred embodiment of the present invention.

An elastic wave device 41 differs from that in the first preferred embodiment in that the third terminal 8 of the first band-pass filter 2A and the fourth terminal 9 of the second band-pass filter 2B are connected with a second connection electrode 46b. In aspects other than those described above, the elastic wave device 41 has the same or substantially the same configuration as the elastic wave device 1 in the first preferred embodiment.

As in the present preferred embodiment, even in the case in which a common connection between the first and second band-pass filters 2A and 2B is connected to the antenna, a higher-order mode in the first band-pass filter 2A is able to be effectively reduced or prevented.

The second piezoelectric substrate 4B on which the second band-pass filter 2B is provided is preferably made of $LiTaO_3$, for example. For this reason, a response due to bulk radiation occurs on a higher-frequency side than the pass band of the second band-pass filter 2B. On the other hand, the first piezoelectric substrate 4A on which the first band-pass filter 2A is provided is preferably made of LiNbO$_3$, for example. Thus, no response due to bulk radiation occurs on a higher-frequency side than the pass band of the first band-pass filter 2A.

In the present preferred embodiment, the pass band of the first band-pass filter 2A is preferably Band 25 and is located on a lower-frequency side than Band 4 that is the pass band of the second band-pass filter 2B. Thus, even if a response due to bulk radiation in the second band-pass filter 2B leaks to a first band-pass filter 2A side via the second connection electrode 46b, deterioration of insertion loss in the pass band of the first band-pass filter 2A is less likely to occur. In addition, deterioration of insertion loss in the pass band of the second band-pass filter 2B is less likely to occur.

It is preferable that the band elimination filter 3 is connected to, among the terminals of the first band-pass filter 2A, the first terminal 6 that is a terminal not connected to another band-pass filter. Thus, even when a higher-order mode occurs in the band elimination filter 3, for example, deterioration of insertion loss of the other band-pass filter is less likely to occur.

The band elimination filter 3 may be connected to, among the terminals of the first band-pass filter 2A, a terminal other than the first terminal 6.

Figure 9:
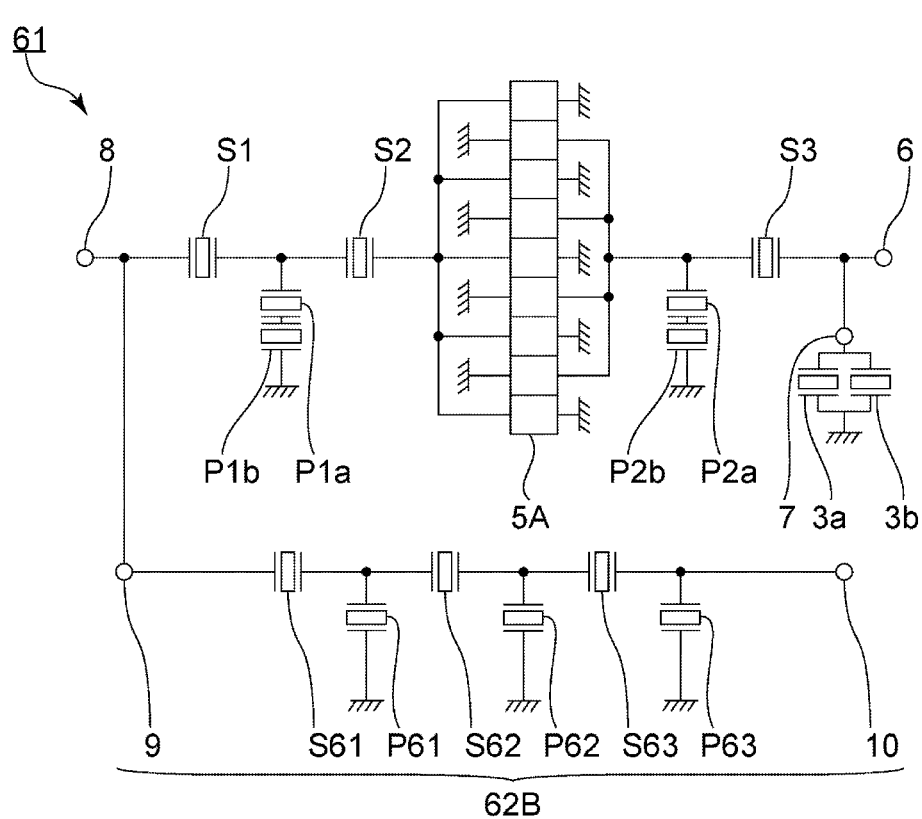
FIG. 9 is a circuit diagram of an elastic wave device according to a modification of the fourth preferred embodiment of the present invention.

As in a modification of the fourth preferred embodiment illustrated in FIG. 9, an elastic wave device 61 may preferably be a duplexer including a transmission filter defined by a second band-pass filter 62B. The configuration of the second band-pass filter 62B is not limited to a particular configuration, and the second band-pass filter 62B is preferably a ladder filter, for example.

More specifically, the second band-pass filter 62B includes a plurality of series arm resonators S61 to S63 connected in series with each other between the fourth terminal 9 and the fifth terminal 10. A parallel arm resonator P61 is connected between a connection point between the series arm resonator S61 and the series arm resonator S62 and the ground potential. A parallel arm resonator P62 is connected between a connection point between the series arm resonator S62 and the series arm resonator S63 and the ground potential. A parallel arm resonator P63 is connected between a connection point between the series arm resonator S63 and the fifth terminal 10 and the ground potential.

In this case, a higher-order mode that occurs in the first band-pass filter 2A is able to be reduced or prevented.

Figure 10:
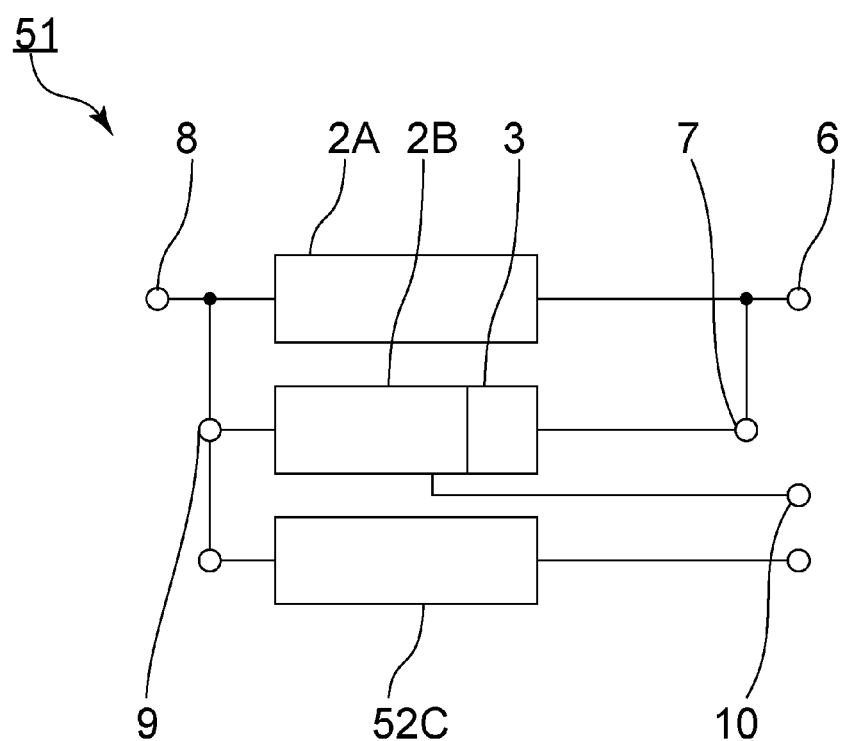
FIG. 10 is a schematic diagram of an elastic wave device according to a fifth preferred embodiment of the present invention.

FIG. 10 is a schematic diagram of an elastic wave device according to a fifth preferred embodiment of the present invention.

An elastic wave device 51 differs from that in the fourth preferred embodiment in that the elastic wave device 51 includes a third band-pass filter 52C connected to the common connection between the first and second band-pass filters 2A and 2B on an antenna side. In aspects other than those described above, the elastic wave device 51 has the same or substantially the same configuration as the elastic wave device 41 in the fourth preferred embodiment.

A pass band of the third band-pass filter 52C is not limited to a particular pass band, and the pass band is preferably located at the WiFi band in the present preferred embodiment.

In the present preferred embodiment, a higher-order mode in the first band-pass filter 2A is able to be reduced or prevented. In the present preferred embodiment, as in the first preferred embodiment, a higher-order mode in the vicinity of the WiFi band is reduced or prevented. Thus, deterioration of insertion loss in the pass band of the third band-pass filter 52C connected to the first band-pass filter 2A so as to achieve a common connection is less likely to occur.

The number of band-pass filters connected to the common connection between the first and second band-pass filters 2A and 2B on the antenna side is not limited to a particular number.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a first piezoelectric substrate made of LiNb03;
   a first band-pass filter provided on the first piezoelectric substrate and including a plurality of first IDT electrodes;
   a dielectric layer provided on the first piezoelectric substrate and covering the plurality of first IDT electrodes;
   at least one other piezoelectric substrate including a second piezoelectric substrate;
   a second band-pass filter provided on the second piezoelectric substrate, including a plurality of second IDT electrodes, and differing from the first band-pass filter in pass band; and
   a band elimination filter connected to the first band-pass filter; wherein
   the band elimination filter is provided on the at least one other piezoelectric substrate;
   the first band-pass filter includes a first terminal that is one of an input terminal and an output terminal;
   the band elimination filter includes a second terminal connected to the first terminal;
   the second band-pass filter includes a plurality of input and output terminals; and
   a distance between the second terminal and the first terminal is shorter than a distance between any of the plurality of input and output terminals included in the second band-pass filter and the first terminal.

2. The elastic wave device according to claim 1, wherein the band elimination filter is connected between the first terminal and a ground potential.

3. The elastic wave device according to claim 2, wherein the band elimination filter includes a plurality of parallel arm resonators connected in parallel between the first terminal and the ground potential.

4. The elastic wave device according to claim 2, wherein the second band-pass filter includes a plurality of terminals that include the plurality of input and output terminals of the second band-pass filter;
   and
   a distance between the second terminal and the first terminal is shorter than a distance between any terminal included in the second band-pass filter and the first terminal.

5. The elastic wave device according to claim 4, wherein the band elimination filter includes two parallel arm resonators; and
   the two parallel arm resonators are connected in parallel with each other between the second terminal and the ground potential.

6. The elastic wave device according to claim 1, wherein the band elimination filter is provided on the second piezoelectric substrate.

7. The elastic wave device according to claim 1, wherein the second piezoelectric substrate is made of $LiTaO_3$.

8. The elastic wave device according to claim 7, wherein the first band-pass filter includes a third terminal connected to an antenna, the plurality of input and output terminals of the second band-pass filter includes a fourth terminal connected to the antenna, and the third terminal and the fourth terminal are connected; and
a pass band of the first band-pass filter is located on a lower-frequency side than a pass band of the second band-pass filter.

9. The elastic wave device according to claim 1, wherein the band elimination filter includes at least one third IDT electrode.

10. The elastic wave device according to claim 9, wherein a shortest distance between centers of electrode fingers in the third IDT electrode is shorter than a shortest distance between centers of electrode fingers in the plurality of second IDT electrodes.

11. The elastic wave device according to claim 1, wherein the first band-pass filter is an LTEB and 25 reception filter.

12. The elastic wave device according to claim 1, wherein the second band-pass filter is an LTE Band 4 reception filter.

13. The elastic wave device according to claim 1, wherein
the first terminal of the first band-pass filter is an output terminal; and
the band elimination filter is connected between the first terminal and a ground potential.

14. The elastic wave device according to claim 1, wherein
the first band-pass filter includes a plurality of elastic wave resonators and a first longitudinally coupled resonator elastic wave filter; and
the plurality of elastic wave resonators and the first longitudinally coupled resonator elastic wave filter each include the plurality of first IDT electrodes.

15. The elastic wave device according to claim 1, wherein
the at least one piezoelectric substrate further includes a third piezoelectric substrate made of $LiTaO3$; and
the band elimination filter is provided on the third piezoelectric substrate.

16. The elastic wave device according to claim 1, wherein
the second band-pass filter includes a plurality of elastic wave resonators, and a plurality of longitudinally coupled resonator elastic wave filters; and
the plurality of elastic wave resonators and the plurality of longitudinally coupled resonator elastic wave filters each include the plurality of second IDT electrodes.

17. The elastic wave device according to claim 1, wherein the dielectric layer is made of $SiO_2$.

18. The elastic wave device according to claim 1, further comprising:
a support member provided on the first piezoelectric substrate; and
a cover member provided on the support member; wherein
a hollow space is surrounded by the first piezoelectric substrate, the support member, and the cover member.

19. The elastic wave device according to claim 1, further comprising:
a support member provided on the second piezoelectric substrate; and
a cover member provided on the support member; wherein
a hollow space is surrounded by the second piezoelectric substrate, the support member, and the cover member.

20. An elastic wave device comprising:
a first piezoelectric substrate made of $LiNb03$;
a first band-pass filter provided on the first piezoelectric substrate and including a plurality of first IDT electrodes;
a dielectric layer provided on the first piezoelectric substrate and covering the plurality of first IDT electrodes;
at least one other piezoelectric substrate including a second piezoelectric substrate;
a second band-pass filter provided on the second piezoelectric substrate, including a plurality of second IDT electrodes, and differing from the first band-pass filter in pass band; and
a band elimination filter connected to the first band-pass filter; wherein
the band elimination filter is provided on the at least one other piezoelectric substrate;
the band elimination filter includes at least one third IDT electrode; and
a shortest distance between centers of electrode fingers in the third IDT electrode is shorter than a shortest distance between centers of electrode fingers in the plurality of second IDT electrodes.

21. An elastic wave device comprising:
a first piezoelectric substrate made of $LiNb03$;
a first band-pass filter provided on the first piezoelectric substrate and including a plurality of first IDT electrodes;
a dielectric layer provided on the first piezoelectric substrate and covering the plurality of first IDT electrodes;
at least one other piezoelectric substrate including a second piezoelectric substrate;
a second band-pass filter provided on the second piezoelectric substrate, including a plurality of second IDT electrodes, and differing from the first band-pass filter in pass band; and
a band elimination filter connected to the first band-pass filter; wherein
the band elimination filter is provided on the at least one other piezoelectric substrate; and
the dielectric layer is made of $SiO_2$.

* * * * *